United States Patent
Lane et al.

(10) Patent No.: US 6,891,275 B2
(45) Date of Patent: May 10, 2005

(54) METHOD FOR ACCOMMODATING SMALL MINIMUM DIE IN WIRE BONDED AREA ARRAY PACKAGES

(75) Inventors: Ryan Lane, San Diego, CA (US); Edward Reyes, San Diego, CA (US); Mark Veatch, San Diego, CA (US); Tom Gregorich, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/624,787

(22) Filed: Jul. 21, 2003

(65) Prior Publication Data

US 2004/0075178 A1 Apr. 22, 2004

Related U.S. Application Data

(60) Provisional application No. 60/399,091, filed on Jul. 26, 2002.

(51) Int. Cl.[7] .............................................. H01L 29/40
(52) U.S. Cl. ......................................... 257/786; 257/737
(58) Field of Search .................................. 257/666, 737, 257/738, 778, 786, 772

(56) References Cited

U.S. PATENT DOCUMENTS

| | | | |
|---|---|---|---|
| 5,545,923 A | 8/1996 | Barber | 257/691 |
| 5,691,568 A | * 11/1997 | Chou et al. | 257/691 |
| 5,898,213 A | * 4/1999 | Torres et al. | 257/666 |
| 6,407,456 B1 | 6/2002 | Ball | 257/777 |

* cited by examiner

*Primary Examiner*—Roy Potter
(74) *Attorney, Agent, or Firm*—Philip Wadsworth; Charles D. Brown; Howard H. Seo (57) ABSTRACT

An area array package comprising a die attach area for attaching a die to a substrate, a network of staggered bond fingers, and a network of bond islands for coupling bond wires between the bond islands and die bond pads is provided. A network of package leads, for example, a network of solder balls in a ball grid array, is depopulated to permit greater trace route flexibility and via placement within the substrate. Stacked die and multi-chip packages are also disclosed. A method for accommodating a high pin-count die in an area array package is also included.

12 Claims, 10 Drawing Sheets

METHOD FOR ACCOMMODATING SMALL MINIMUM DIE IN WIRE BONDED AREA ARRAY PACKAGES

RELATED APPLICATIONS

This application claims priority to U.S. Provisional Application No. 60/399,091, filed on Jul. 26, 2002.

FIELD OF THE DISCLOSURE

This disclosure relates generally to microchip packaging. More specifically, the present disclosure relates to a method of accommodating small minimum die in wire bonded area array packages.

BRIEF DESCRIPTION OF THE RELATED ART

Integrated circuit (IC) packages, particularly area array packages such as ball grid arrays (BGA) and land grid arrays (LGA), often contain sophisticated electrical subsystems to connect the many components of a die to a device or circuit board. Over the years, package designers have struggled to keep pace with a modern trend toward higher pin counts brought about by higher integration of feature sets. At the same time, dice have continued to shrink in physical size due in part to significant improvements in wafer processing technology. Complex digital signal processor (DSP), for instance, commonly contain several hundred electrical leads. In an effort to keep pace with these improvements, fundamental changes are needed in the way chips are packaged.

Package designers have tried to accommodate diminishing die size and growing pin counts in a number of ways. One technique involves miniaturizing the physical size of each bond finger. But there is a lower limit to the size of a bond finger—the smallest bond wire is around 0.7 mils in diameter, and a reduced wire diameter also reduces the maximum wire length available. A bond finger must at least be wide enough to accommodate a wire bond. Thus, it is often impractical to further shrink the bond fingers.

Other approaches for accommodating a large pin-count die include rearranging the package's bond finger array to form two or more rows of bond fingers, or forming a ground or power ring to which power and ground pads can be wired. These techniques are difficult to implement in small chip size packages due to limited substrate area.

Another technique for packaging a large pin-count die is to use flip-chip technology, which permits bond pad connections to be interspersed across the entire top surface of the die. However, flip chip packages are expensive in terms of both processing time and substrate and design density. Flip chip arrangements can also carry an increased reliability risk compared to a package that uses wire bonds. Especially for packages where cost constraints force reliance on wire bonded die-to-substrate electrical connections, moving to flip-chip is not always viable.

SUMMARY OF THE DISCLOSURE

Disclosed is a method and an area array package for accommodating a small minimum die. The area array package of the present disclosure utilizes wire bond technology and has a substrate with a plurality of bond fingers located around the periphery of the substrate. A plurality of bond islands are located between the bond fingers and a plurality of bond pads on a die attached to the substrate. Bonding wires make the appropriate electrical connections between the bond fingers, the bond islands, and the bond pads. Each of the bond fingers and the bond islands can accommodate multiple wire bonds.

In one embodiment, the substrate is a laminate substrate having a plurality of layers, each layer including a network of metallurgical traces that, once laminated, couple the bond islands and bond fingers to a network of package leads. The network package leads includes an array of solder balls in a ball grid array (BGA), or a network of lands in a land grid array (LGA). In another embodiment, a network of solder balls comprising a BGA, is depopulated at every other row to permit flexible trace routing and via placement. A stacked multi-chip array and method for accommodating a high pin-count die are also disclosed.

BRIEF DESCRIPTION OF THE DRAWINGS

The disclosure will now be described in greater detail with reference to the preferred embodiments illustrated in the accompanying drawings, in which like elements bear like reference numerals, and wherein.

DETAILED DESCRIPTION

Figure 1:
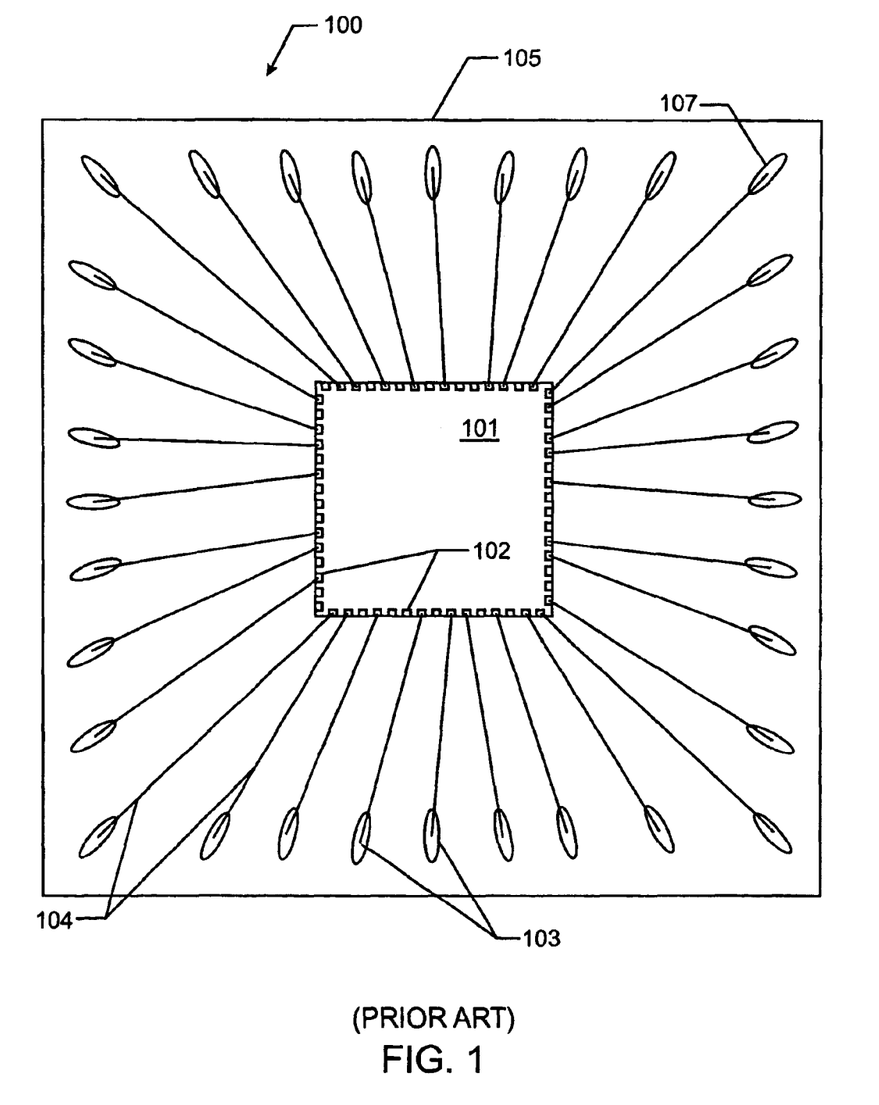
FIG. 1 is a block diagram of an area array package in accordance with the prior art.

FIG. 1 is a block diagram of an area array package 100 in accordance with the prior art. Area array package 100 includes a die 101. The die 101 includes a plurality of die bond pads 102. The die 101 is attached to substrate 105. Substrate 105 includes a plurality of bond fingers 103, 107 for attaching one or more bond wires 104 between the bond fingers 103, 107 and the die bond pads 102. The number of die bond pads 102 corresponds to the number of signal I/Os on die 101 that require connectivity to the printed wiring board (PWB) on which package 100 is deployed. The need to increase the number of die bond pads 102 is increasing more rapidly than the ability of substrate 105 to accommodate an equal number of bond fingers 103, 107. Moreover, the trend toward die miniaturization and the advent of multi-chip packages further strain the current bond finger count.

Bond finger geometry and bond finger location on substrate 105 present other drawbacks of the prior art. For example, the narrow shape of a typical bond finger 103 can limit the angle at which a wire can be bonded to a bond finger 103. As well, the placement of some bond fingers further away from die 101 than others, for example corner bond finger 107, can exceed wire length restrictions.

The package and method of the present disclosure overcome these and other drawbacks inherent in current area array packages exemplified in FIG. 1, by pulling in, or repositioning, a portion of the array's bond fingers and creating a plurality of bond islands, with each bond island being capable of accommodating multiple bond wires. The bond islands also permit greater wire bond angle flexibility. Furthermore, the remaining bond fingers can be staggered to aid in conforming with the minimum wire length constraints of a particular design.

The network of package leads comprising the package's second-level interconnection system can also be depopulated, that is a portion of them removed, to facilitate easier trace routing and via placement. The package and method described herein are therefore suitable for packaging high pin-count die, small minimum die size, and multi-chip packages without jeopardizing wire length constraints and while promoting greater design reuse.

Figure 2:
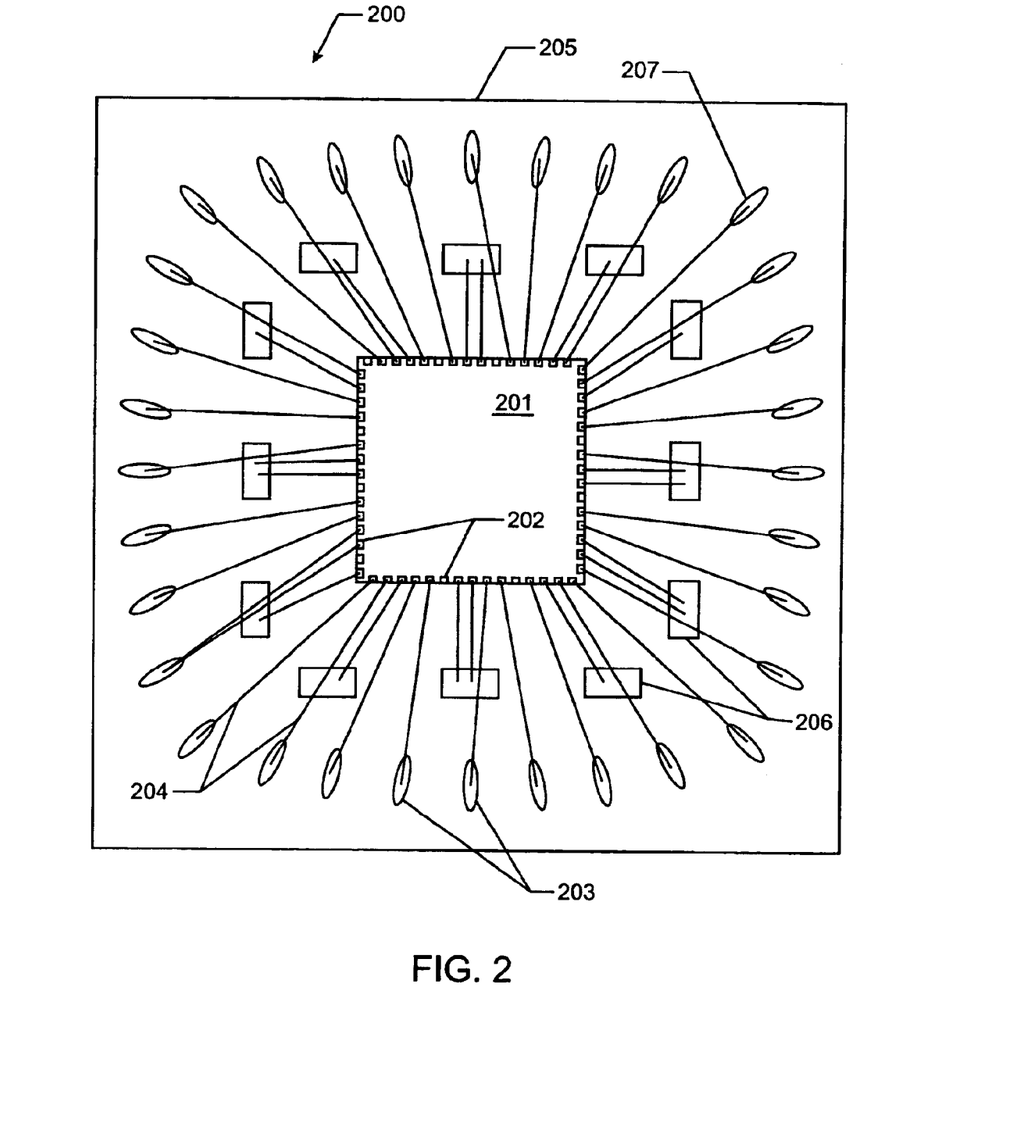
FIG. 2 is a block diagram of an area array package in accordance with an embodiment of the present disclosure.

FIG. 2 is a block diagram of an area array package 200 in accordance with the present disclosure. Area array package 200 comprises die 201, die bond pads 202 located around the periphery of the die, bond fingers 203, 207 generally located around the periphery of the substrate 205, bond islands 206 located between the bond fingers 203, 207 and bond pads 202, and bond wires 204 for electrically connecting the die bond pads 202, bond islands 206 and bond fingers 203, 207.

Die 201 is bonded to substrate 205 using, for instance, an epoxy adhesive, and is usually positioned generally in the center of substrate 205 in an area reserved for a die bond, referred to herein as the die attach area. Substrate 205 is configured to accommodate at least one semiconductor IC or chip, such as an application specific integrated circuit (ASIC), a memory circuit, or a digital signal processor (DSP). However, the package and method of the present disclosure are not limited to a particular type of IC, nor is package 200 limited to a particular die 201 geometry or bond pad 202 arrangement, such as the square die with perimeter pads exemplified in FIG. 2.

Area array package 200 as shown contains a single die 201 mounted to a top side of substrate 205 in a "die-up" configuration. In this arrangement, the bond pads 202 of die 201 are facing upward, visible from the top side view of FIG. 2. Other possible arrangements for mounting die 201 to substrate 205 include a "die-down" configuration, wherein die 201 is mounted on the side of substrate 205 containing the package leads. Still other possible arrangements may be utilized and may include positioning die 201 off-center of the attachment area, as well as recessing die 201 in a cavity created on a surface of substrate 205.

Substrate 205 is the chip carrier for area array package 200 and can comprise any material compatible with a particular assembly, such as plastic, ceramic, or polyimide tape, taking into account such phenomena as the material's thermal expansion of die 201 and of the printed wiring board (PWB) on which the package is ultimately deployed. In one embodiment, for example, substrate 205 may comprise a multi-layer laminate design, which includes layer to layer conduction paths, such as metallized vias, and traces to couple under-side package leads, such as solder balls, with bond islands 206 and bond fingers 203.

Figure 3:
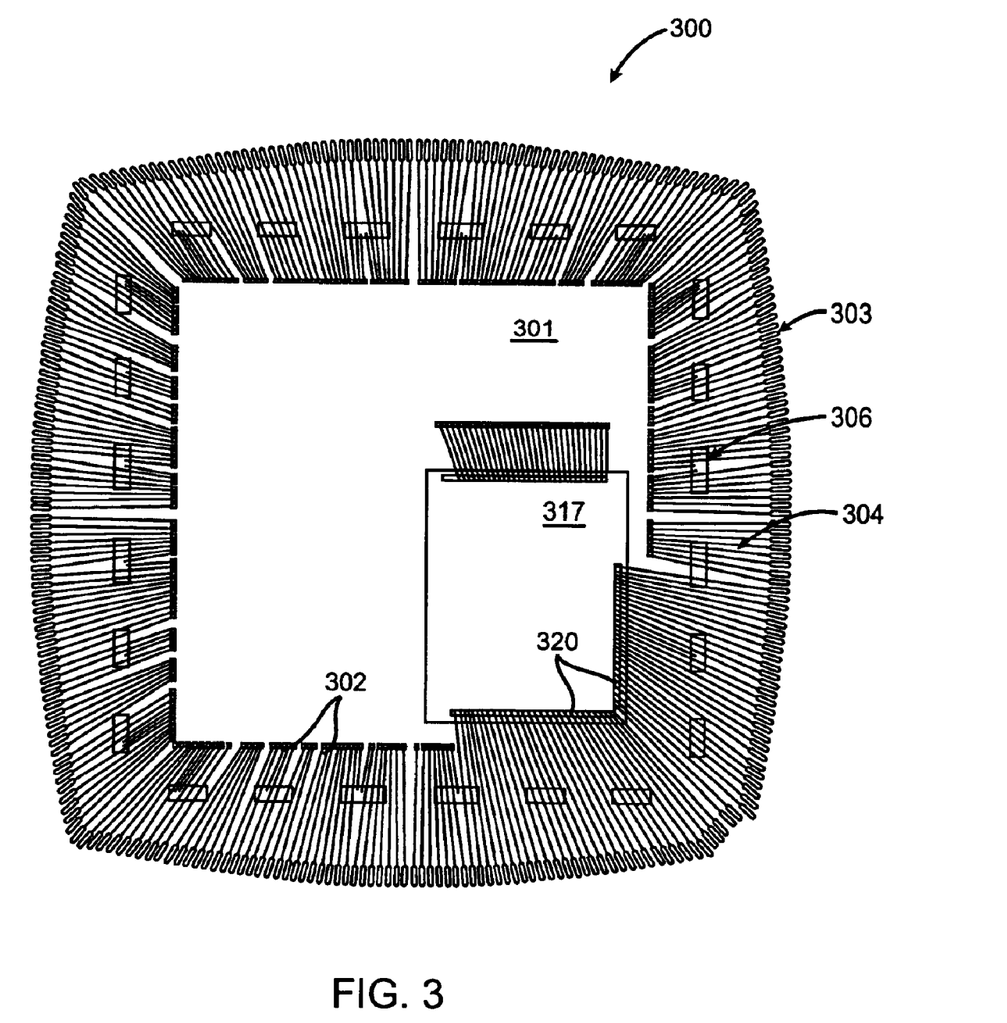
FIG. 3 is a diagram of an area array package arranged in a stacked 2-dice configuration according to an embodiment of the present disclosure.

Package 200 is not limited to a single die configuration. For example, substrate 205 can comprise multiple die attach areas for mounting multiple die, such as in a multi-chip module. In particular, the package and method of the present disclosure are ideal for use in packaging 3D chip modules. For example, substrate 205 can accommodate a plurality of die, by stacking die onto a single die attachment area as shown in FIG. 3.

A network of first-level die-to-substrate contacts is typically formed by connecting a plurality of bond wires 204 that run between each of die bond pad 202 to a bond finger 203 located on the substrate surface. The present disclosure contemplates any available bond type or technique to make the electrical connection between the bond pads 202 and bond fingers 203, including a ball or wedge bond, and ultrasonic or thermal compression. The choice of wire bond methods and materials include commonly used metals such as aluminum or gold, and should be made keeping features of package performance and thermal management in mind.

Area array package 200 represents a significant departure from the prior art technique of adding additional bond fingers to the already crowded array of bond fingers. Rather than packing in extra bond fingers, the package and method of the present disclosure create a network of bond islands 206 located between the bond pads 202 and bond fingers. In one embodiment, a small percentage of bond fingers from bond finger network 203 is pulled in to bring bond island network 206 close to die 201.

In another embodiment, the bond fingers 203 that remain after bond finger depopulation can be staggered to enable even smaller die 201 accommodation, and consequently shorter bond wire 204 lengths. For example, in one implementation bond finger 203 depopulation and a combination of bond fingers 203 and bond islands produce an area array package 200 capable of accommodating a die 201 measuring 6 millimeters on a side. Whereas, using the in-line bond finger configuration of the prior art shown in FIG. 1, the minimum square die achievable was 8 millimeter on a side, based on a maximum wire length.

Other advantages of the present disclosure include an overall reduction in wire length and package dimension. For example, lab results for a 7 millimeter square die package 200 showed a reduced corner bond wire 204 length of 3.11 millimeters, down from 4.45 millimeters, prior to bond finger 203 placement as disclosed herein. In the same example, an overall package 200 dimension was reduced to a 14 mm square package, down from a 15 mm square package.

FIG. 3 is a diagram of an area array package 300 arranged in a stacked die configuration in accordance with an embodiment of the present disclosure. The package shown in FIG. 3 comprises principal die 301, with a secondary die 317 having bond pads 320 located around the periphery of the secondary die 317. The principal die 301 includes bond pads 302 located around the periphery of the principal die 301. The package includes a plurality of bond fingers 303 located around the periphery of the substrate. A plurality of bond islands 306 are located between the bond pads 302, 320 and the bond fingers 303. Bond wires 304 electrically connect the bond pads 302, 320 to the bond fingers 303. A stacked die arrangement is well-suited for optimal bond island 306 utilization because multiple die packages require a high pin-count, which may be provided with the disclosed package. The stacked die configuration shown in FIG. 3 may share the same power and ground leads and therefore a common bond island 306 can be used to make the power or ground connections for the die.

The presence of secondary die 317 often means that one or more secondary die bond pads 320 will need to be connected to a bond finger 303 or to a bond island 306. Because bond pads 320 are further from bond fingers 303 than the bond pads 302 of principal die 301, staggering a percentage of bond fingers 303 to form bond islands 306 results in the bond fingers 303 moving closer to the die attach area, which may help to minimize wire lengths for those wire connections terminating at the secondary die wire pads 320.

Returning to FIG. 2, the bond finger depopulation percentage is usually no more than about 40% of the total bond finger count of the substrate when utilizing the method disclosed herein. In one embodiment, a number of bond islands 206 are placed inside the ring formed by the bond fingers 203. The number of bond islands 206 is a function of bond island functionality, such as whether a particular bond island will be used for multiple bonds or for a power connection as opposed to a signal connection. The number of bond islands is also dependent upon bond island size. Typically the number of bond islands is no higher than about 15% of the total bond finger count.

A bond island 206 is substantially larger in bondable surface area than a bond finger 203. The comparatively larger size of a bond island 206 offers several advantages. Bond islands 206 can be strategically positioned on substrate 205 to be near the die attach area so that wire bond lengths can be minimized. Wire bond length constraints are particularly important for bond wires 204 that will carry power or ground current to or from die 201. However, bond islands 206 may also be used to mount bond wires 204 carrying other signals, such as control signals and data, depending on the application of the package.

A single bond island 206, being larger than a typical bond finger 203, can accommodate multiple wire bonds. A typical bond finger 203 is large enough to accommodate just two wire bonds. In contrast, up to approximately eight wires 204 can be mounted to a single bond island 206 of the present disclosure. The number of bonds per bond island 206 is dependent upon island size, as well as the bonding technology and equipment. As a result, according to the present disclosure, a designer has more options in designing wire bond configuration and placement to optimize signal strength, package configuration, and to minimize interference. Unlike the narrow shape of a bond finger 203, the surface geometry of a bond island 206 allows bond wires 204 to be affixed to the bond island 206 at a number of different angles, thereby increasing bond pad 202 placement flexibility atop the surface of die 201.

Figure 4:
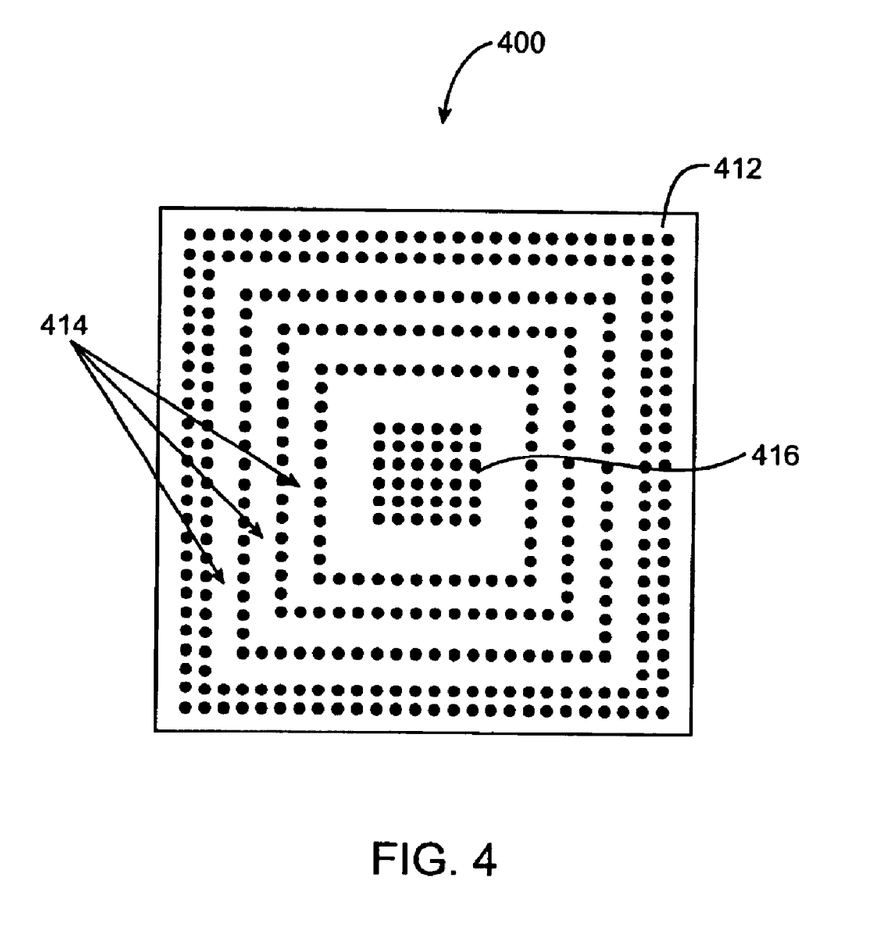
FIG. 4 is a diagram of a depopulated BGA in accordance with an embodiment of the present disclosure.

The package of the present disclosure is suitable for use in the back-end processing of an IC into an area array package comprising a network of package leads for mounting the package to a PWB. In one embodiment, the area array is a BGA or LGA. FIG. 4 illustrates a depopulated BGA 400. FIG. 4 comprises a pair of outer solder ball rows 412. Located inward of the outer solder ball rows 412 are an additional three rows of depopulated solder balls 414. Centrally located on the substrate is a central square grid of solder balls 416. Each row of solder balls 414 is arranged to form a set of concentric squares around central solder ball grid 416. In this embodiment, every other row of solder balls in the grid has been depopulated or removed to allow greater design flexibility, except for the outer row 412 because this row generally coincides with the ring of staggered bond fingers 203 from the opposite side of substrate 205.

Trace routing and via placement are made easier by the elimination of excess solder balls which might otherwise act as obstacles. Solder balls can be, for example, small spherical bumps of solder attached to substrate 205 by an eutectic bond or paste.

One consequence of packaging a high pin-count die is the proliferation of electrical paths that must accompany a growing array of bond fingers and package leads in order to establish complete die-to-PWB connectivity. As a result, a package's second-level interconnect system may comprise an intricate metal patchwork of traces and vias patterned layer by layer onto one or more sheets. The package disclosed herein provides improved trace routing and via placement, which is shown with reference to metalization layers shown in FIGS. 5–7.

Figure 5:
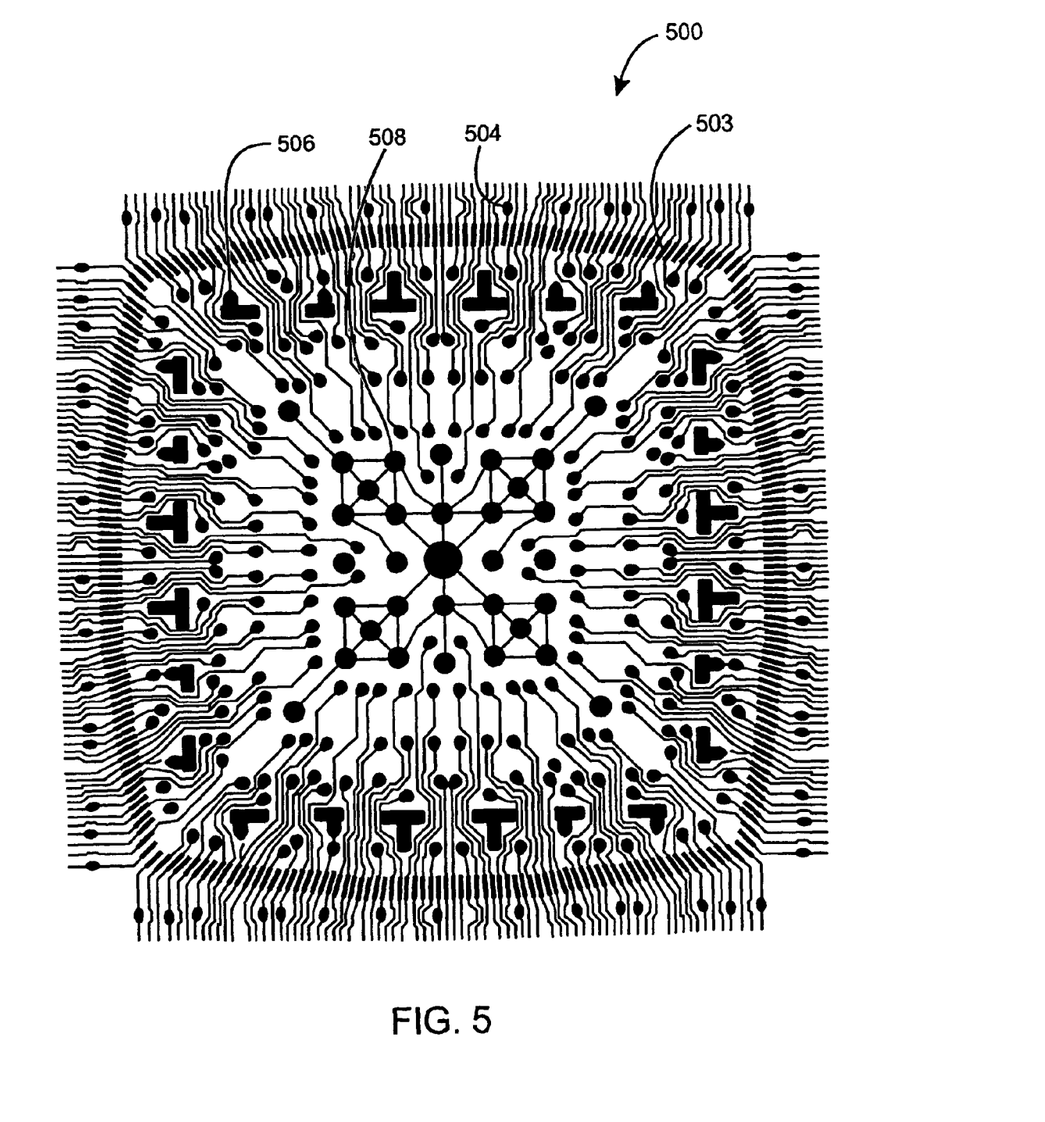
FIG. 5 is a schematic diagram of a top metal layer of a chip scale package (CSP) substrate in accordance with an embodiment of the present disclosure.

FIG. 5 is an examplary schematic diagram of a top metal layer 500 of a chip scale package (CSP) substrate in accordance with the present disclosure. FIG. 5 illustrates bond fingers 503, bond islands 506, a network of via pads 504, and die attach area 508. The network of via pads 504 is part of the second-level interconnection system that provides connectivity between top metal layer 500 and the solder ball array of FIG. 4. Top metal layer 500 may be one layer from a multi-layer laminate substrate.

The bond islands 506 are generally "L" or "T" shaped. The bondable area of a bond island 506 can vary, depending on such factors as trace route positioning and solder mask dimensions. The bond islands 506 also include metal below the bondable surface. Hence, bond islands 506 can also include a via extending through the substrate for connecting an intermediate or bottom metal layer (not shown) of the substrate.

Figure 6:
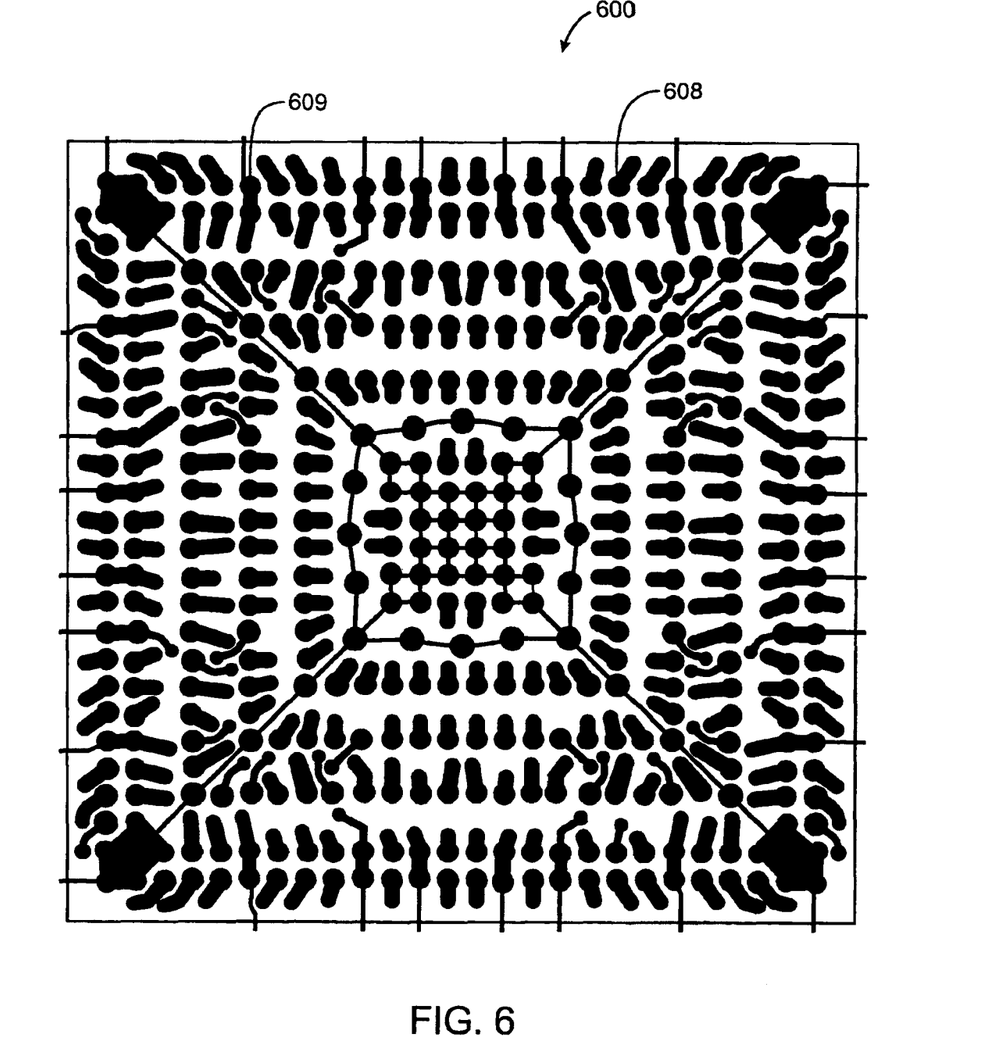
FIG. 6 is a schematic diagram of a bottom metal layer of a chip scale package (CSP) substrate further in accordance with the embodiment shown in FIG. 5.
Figure 7:
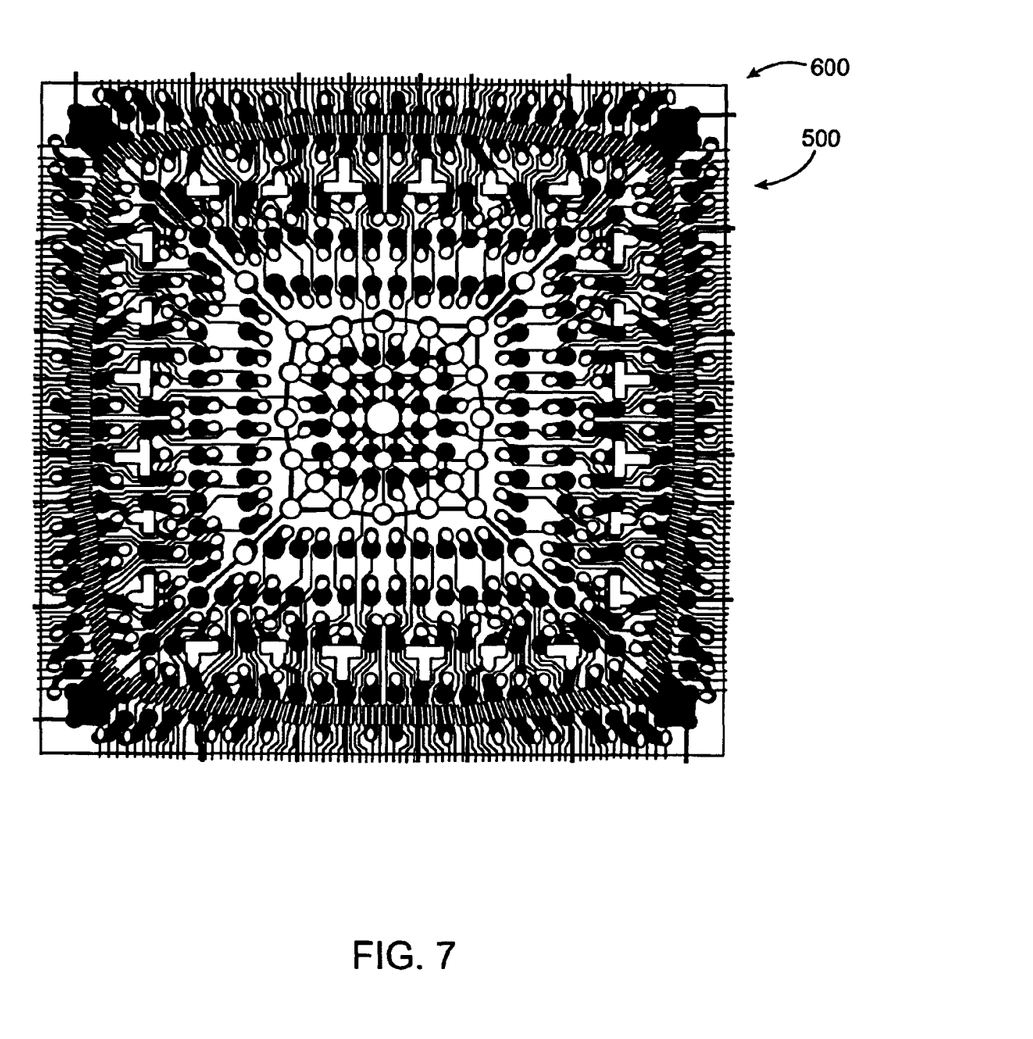
FIG. 7 is a schematic diagram of the top metal layer of FIG. 5 superimposed atop the bottom metal layer of FIG. 6.

FIG. 6 illustrates a bottom layer 600 of a chip scale package (CSP) substrate further in accordance with the embodiment shown in FIG. 5. The bottom layer 600 includes solder ball pads 608 and redundant solder balls 609. Solder ball pads 608 are generally dog bone shaped, wherein the narrow end of a pad 608 is a via pad electrically coupled to a via pad 504 from top metal layer 500, and wherein the wide end of a pad 608 accommodates a solder ball (not shown in FIG. 6). The wide end of the solder ball pads 608 align with the depopulated ball grid array depicted in FIG. 4, and as further shown in the superimposed top and bottom layer image shown in FIG. 7. Redundant solder balls 609 are also shown in FIG. 6. Plating trace routing can be further facilitated by strategically positioning pairs of adjacent solder balls that share an electrical connection to upper layers of the substrate. The redundant solder balls 609 allow a path for the inner solder balls connected to bond islands 206 to be electrically plated.

Figure 8:
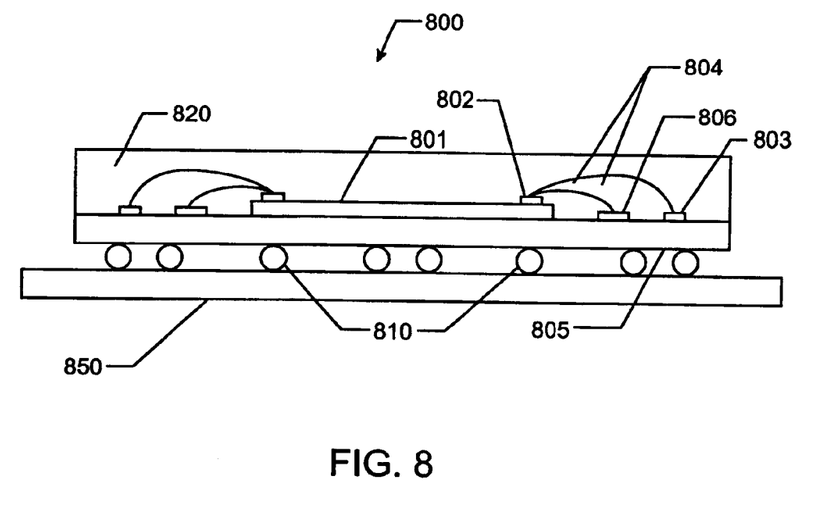
FIG. 8 is a side elevation view showing a cross-section of the area array package in accordance with present disclosure.

FIG. 8 is a side elevation view showing a cross-section of a deployed area array package 800. Die 801 is mounted in a "die-up" configuration onto substrate 805. Bond pads 802 near the perimeter of die 801 are coupled to bond islands 806 and to bond fingers 803 using bond wires 804. A depopulated network of solder balls 810 electrically couples substrate 805 to printed wiring board 850. Finally, enclosure 820 completes package 800 by providing environmental and mechanical protection to package 800. Enclosure 820 may be made of epoxy resin materials, depending upon the application and environment in which package 800 is to be deployed.

Figure 9:
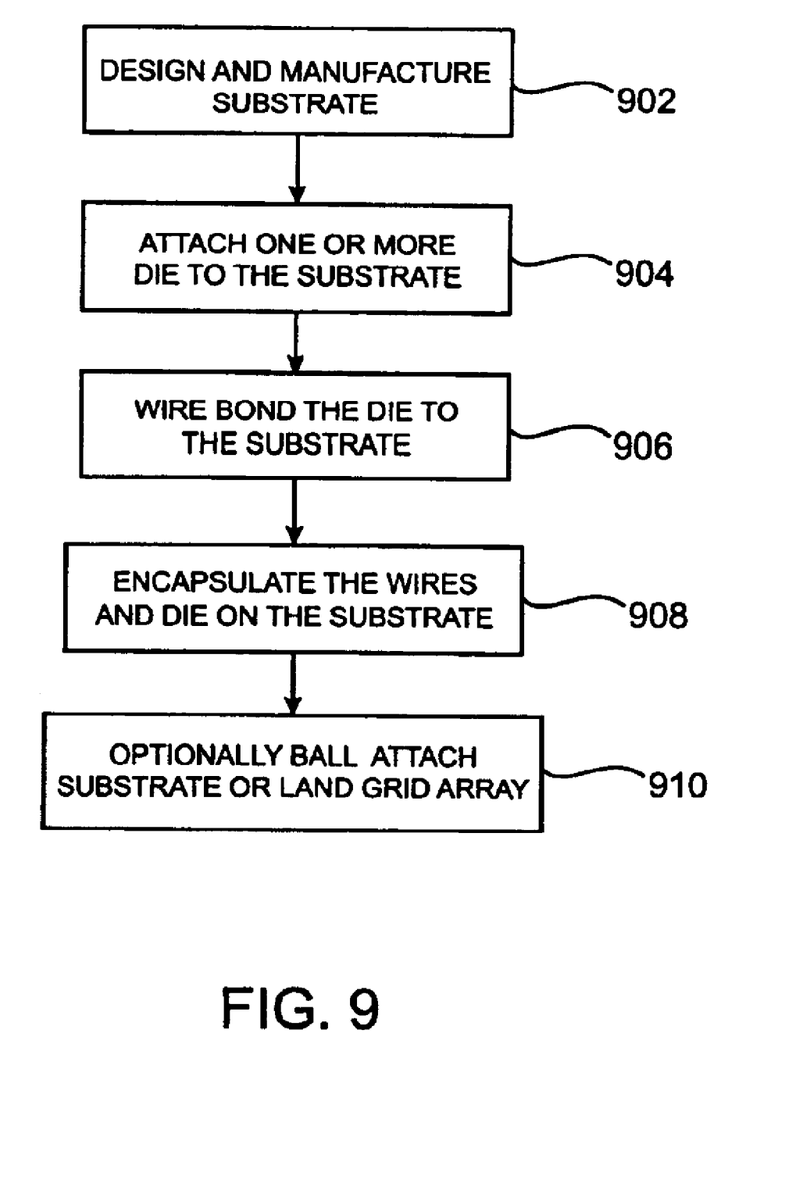
FIG. 9 is a flow diagram of a method for accommodating a high pin-count die in accordance with the present disclosure.

FIG. 9 is a flow diagram of a method for accommodating a small minimum die in an area array package as disclosed herein. In step 902, the substrate is designed and manufactured. The substrate can comprise, for example, a plurality of layers (see FIGS. 5–7) that can be laminated to form a laminate substrate. Next, at step 904, one or more die are attached to the substrate using an adhesive or an eutectic bond. At step 906, the die is wire bonded to the substrate. At step 908, the wires and the die on the substrate are encapsulated for environmental and mechanical protection. Enclosure involves choosing a suitable encapsulant and encapsulation technique, for example, an epoxy molding compound using a transfer molding process, or the like, may be used. Step 910 is optional and includes the step to ball attach the substrate using solder balls in a ball grid array or utilize a network of lands in a land grid array. The encapsulated package can be deployed in a device or product, such as on board a wireless handset, for final shipment to the customer or end-user.

Figure 10:
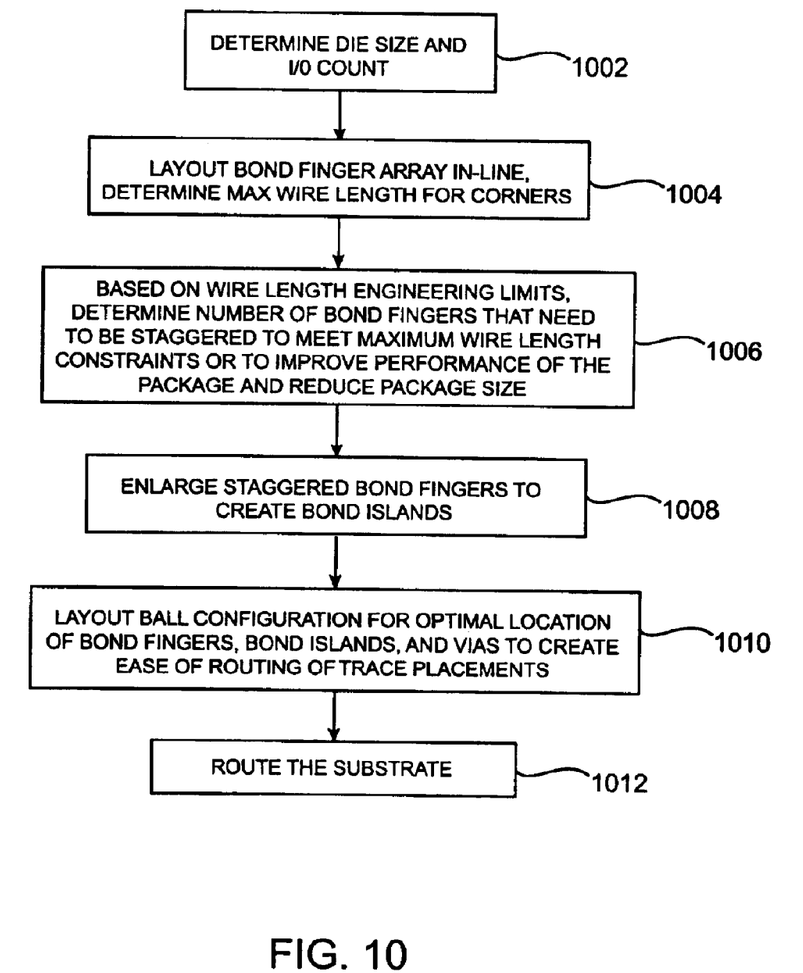
FIG. 10 is a flow diagram of a method of designing the area array package.

FIG. 10 illustrates the design method for designing the package disclosed herein. Step 1002 includes the die size and I/O count determination. Step 1004 includes the layout of the bond finger array that is in-line, and the determination of the maximum wire length for the corner bond fingers. Next, as shown in step 1006, based on the wire length engineering limitations, a determination is made of the number of bond fingers that need to be staggered to meet the maximum wire length constraints or to improve performance of the package and reduce package size. Next, at step 1008, the staggered bond fingers are enlarged to create bond islands. At step 1010 a ball configuration layout is created for optimal location of the bond fingers, bond islands, and vias to create the best and easiest routings of the trace placements. Step 1012 includes the routing of the substrate.

The package and method for accommodating small minimum die in area array packages are ideally suited to overcome drawbacks of the prior art by providing flexibility in the packaging of high pin-count, small minimum size die. In particular, the package and method are well suited for a die having a 60 micron pad pitch or smaller. Additionally, the teachings of the present disclosure avoid the high cost of customizing a substrate for each new die because bond islands can enhance package design reuse.

Although this disclosure has been shown and described with respect to specific embodiments, those skilled in the art will understand that various changes in form and detail may be made without departing from the scope of the package and method described.

We claim:

1. An area array package, comprising:
   a substrate having a die attach area for mounting a die to the substrate, the die having a plurality of bond pads;
   at least one bond island located on the substrate;
   at least one bond wire for connecting at least one bond pad to at least one bond island;
   a plurality of solder balls connected to the bond islands, the plurality of solder balls being located inwardly from an edge of the substrate; and
   at least one redundant solder ball to allow a path for the inner solder balls connected to bond islands to be electrically plated.

2. The area array package of claim 1, further comprising an encapsulant for environmentally protecting the package.

3. The area array package of claim 1, further comprising a trace for coupling at least one bond island to a package lead located on one side of the substrate.

4. The area array package of claim 1, further comprising a via for coupling at least one bond island to the package lead.

5. The area array package of claim 3, wherein the die attach area is located on a side of the substrate that is opposite the side of the package lead.

6. The area array package of claim 3, wherein the package lead is a solder ball included in a ball grid array (BGA).

7. The area array package of claim 3, wherein the package lead is a land included in a land grid array (LGA).

8. The area array package of claim 1, further comprising at least one bond finger for coupling a bond wire between at least one bond finger and at least one bond pad.

9. The area array package of claim 8, further comprising a trace for coupling the bond finger to a package lead.

10. The area array package of claim 8, further comprising a via for coupling the bond finger to a package lead.

11. The area array package of claim 1, wherein the substrate comprises a plurality of die attach areas for mounting a plurality of die.

12. The area array package of claim 1, wherein the substrate is a laminate substrate.

\* \* \* \* \*